(12) United States Patent
Ogihara

(10) Patent No.: US 7,811,841 B2
(45) Date of Patent: Oct. 12, 2010

(54) SEMICONDUCTOR COMPOSITE DEVICE, METHOD FOR MANUFACTURING THE SEMICONDUCTOR COMPOSITE DEVICE, LED HEAD THAT EMPLOYS THE SEMICONDUCTOR COMPOSITE DEVICE, AND IMAGE FORMING APPARATUS THAT EMPLOYS THE LED HEAD

(75) Inventor: Mitsuhiko Ogihara, Hachioji (JP)

(73) Assignee: Oki Data Corporation, Tokyo (JP)

( * ) Notice: Subject to any disclaimer, the term of this patent is extended or adjusted under 35 U.S.C. 154(b) by 243 days.

(21) Appl. No.: 12/230,518

(22) Filed: Aug. 29, 2008

(65) Prior Publication Data

US 2009/0004811 A1 Jan. 1, 2009

Related U.S. Application Data

(62) Division of application No. 11/221,754, filed on Sep. 9, 2005, now Pat. No. 7,432,523.

(30) Foreign Application Priority Data

Sep. 14, 2004 (JP) .............................. 2004-266834

(51) Int. Cl.
*H01L 21/00* (2006.01)
(52) U.S. Cl. ........................................ 438/22; 438/455

(58) Field of Classification Search .................. 438/22, 438/455
See application file for complete search history.

(56) References Cited

U.S. PATENT DOCUMENTS

| 5,473,192 | A | 12/1995 | Golubic et al. |
| 5,798,537 | A | 8/1998 | Nitta |
| 7,078,729 | B2 | 7/2006 | Suzuki et al. |
| 2005/0112805 | A1 | 5/2005 | Goto et al. |

FOREIGN PATENT DOCUMENTS

| CN | 1397984 A | 2/2003 |
| CN | 1449060 A | 10/2003 |
| JP | 61-182217 | 8/1986 |
| JP | 6-333962 | 12/1994 |
| JP | 11-186598 | 7/1999 |

*Primary Examiner*—Evan Pert
(74) *Attorney, Agent, or Firm*—Rabin & Berdo, PC

(57) ABSTRACT

A semiconductor composite apparatus includes a semiconductor thin film and a metal layer formed on a substrate. The semiconductor thin film is bonded to the metal layer formed on the substrate. A region is formed between the semiconductor thin film and the metal surface, and contains an oxide of a metal that forms the metal surface. The metal surface is a surface of a metal layer provided on the substrate. The metal surface contains an element selected from the group consisting of Pd, Ni, Ge, Pt, Ti, Cr, and Au. The metal surface is coated with either a Pd layer or an Ni layer.

5 Claims, 16 Drawing Sheets

EXAMPLE OF SEMICONDUCTOR THIN FILM

205 SECOND CONTACT LAYER P-TYPE GaAs
204 SECOND CLAD LAYER
203 ACTIVE LAYER
202 FIRST CLAD LAYER
201 FIRST CONTACT LAYER n-TYPE GaAs

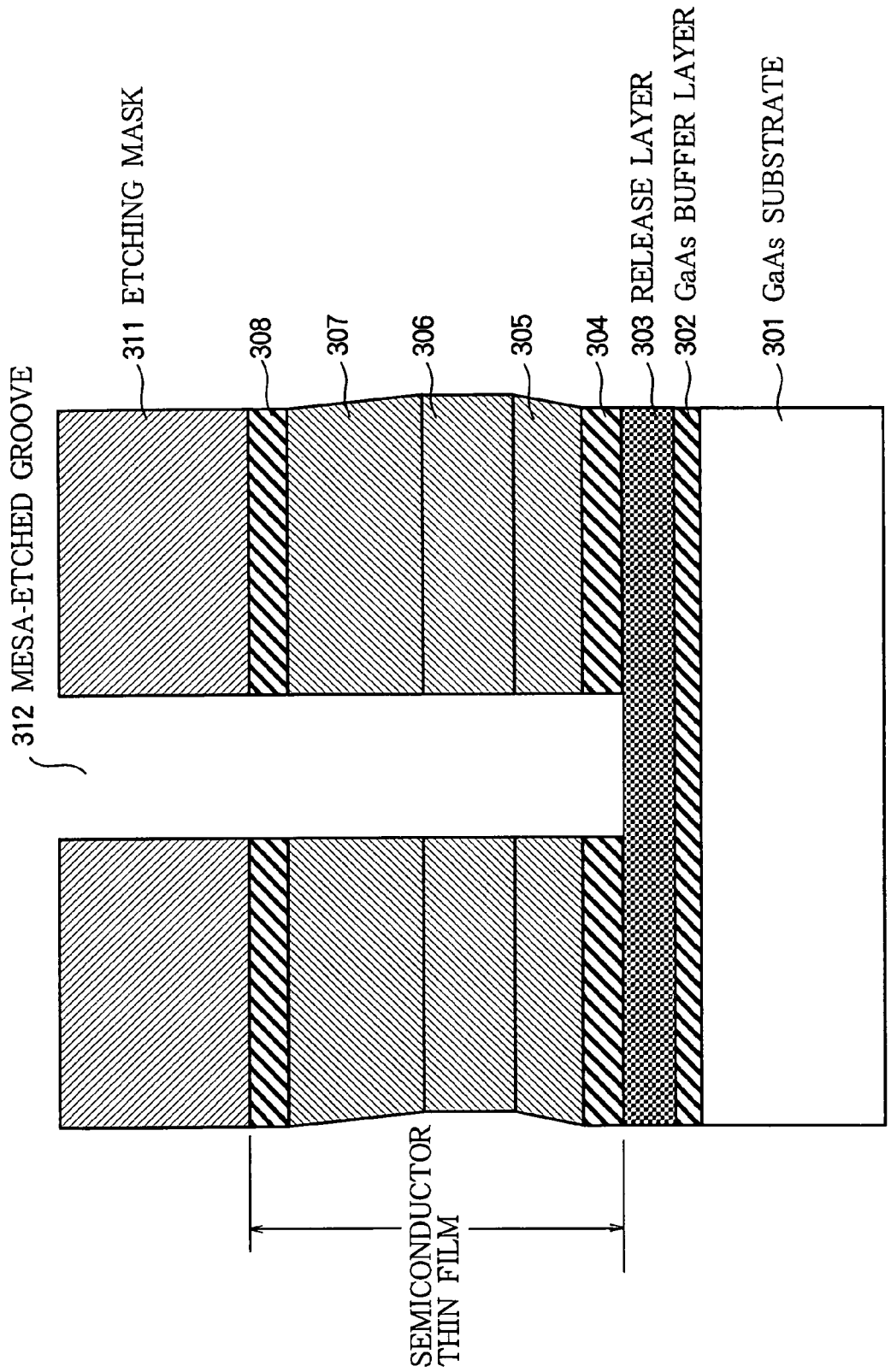

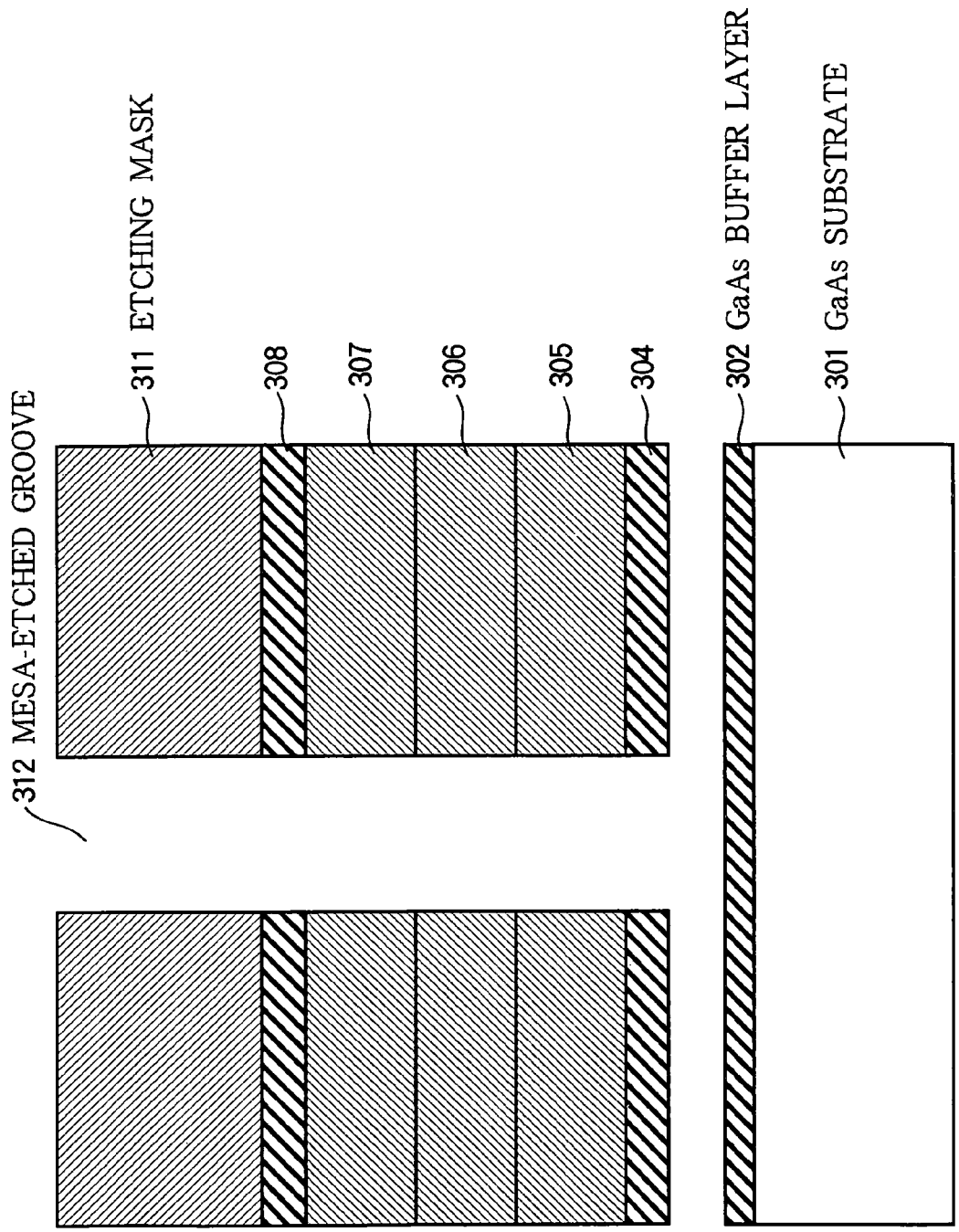

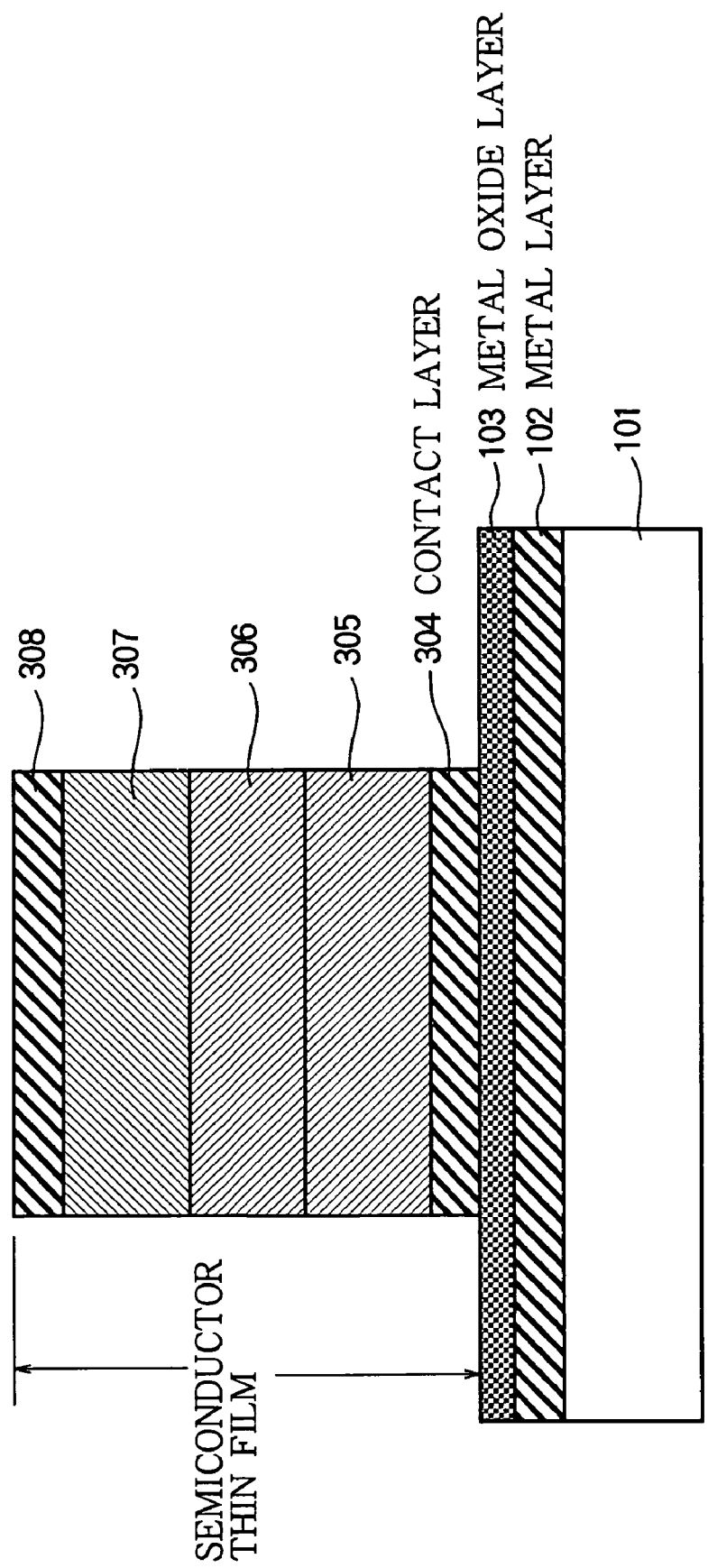

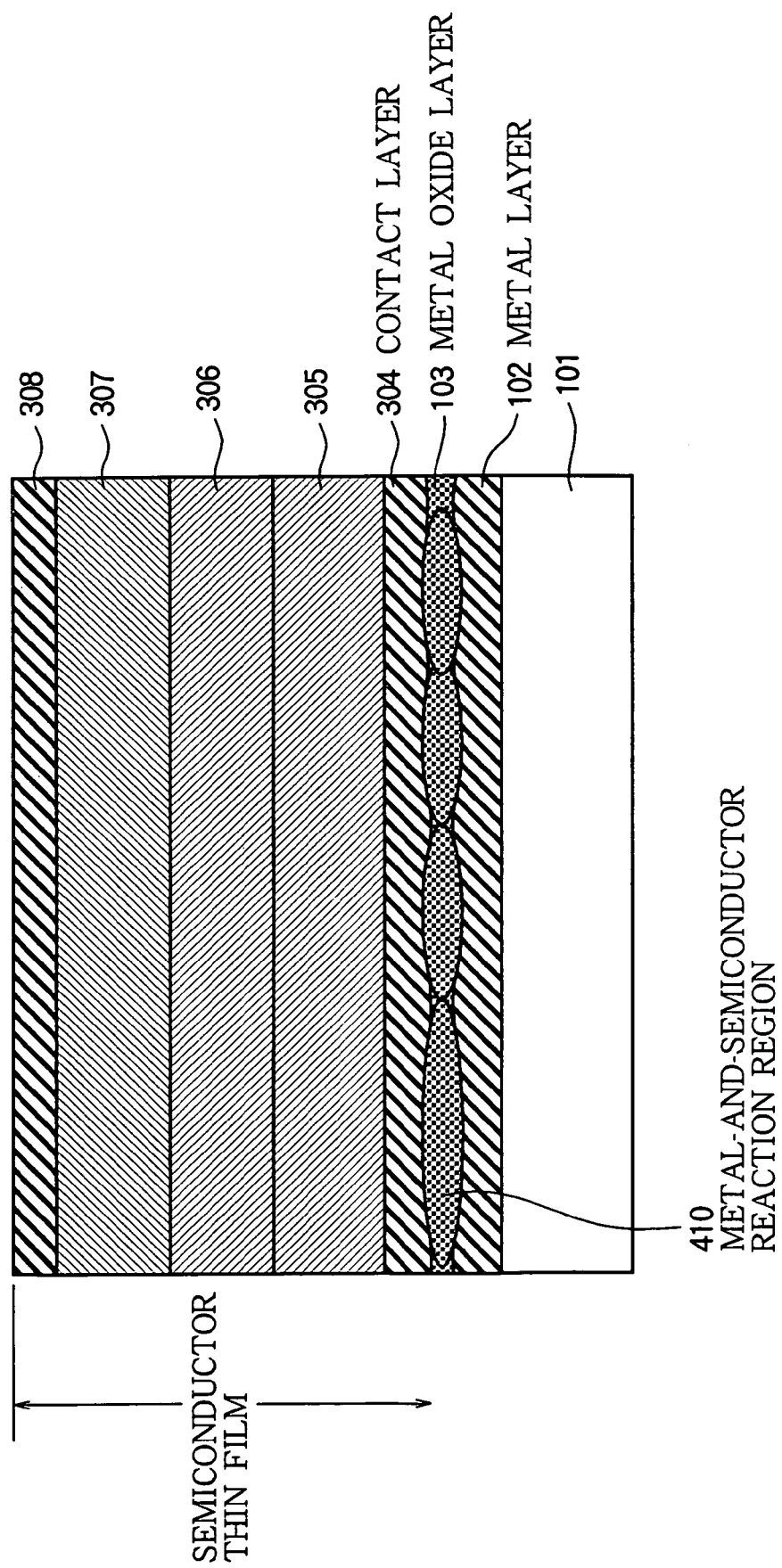

- 104 SEMICONDUCTOR THIN FILM
- 501 METAL LAYER
- 502 METAL OXIDE LAYER
- 101 SUBSTRATE

- 104 SEMICONDUCTOR THIN FILM
- 501 METAL LAYER
- 502 METAL OXIDE LAYER
- 101
- 710 METAL COMPOUND

SEMICONDUCTOR COMPOSITE DEVICE, METHOD FOR MANUFACTURING THE SEMICONDUCTOR COMPOSITE DEVICE, LED HEAD THAT EMPLOYS THE SEMICONDUCTOR COMPOSITE DEVICE, AND IMAGE FORMING APPARATUS THAT EMPLOYS THE LED HEAD

CROSS REFERENCE TO RELATED APPLICATION

This is a divisional of parent application Ser. No. 11/221,754, filed Sep. 9, 2005 now U.S. Pat. No. 7,432,523, and allowed on May 29, 2008. The entire disclosure of the parent application is incorporated herein by reference.

BACKGROUND OF THE INVENTION

1. Field of the Invention

The present invention relates to a semiconductor composite device, a method for manufacturing the semiconductor composite device, an LED head that employs the semiconductor composite device, and an image forming apparatus that employs the LED head.

2. Description of the Related Art

FIG. 11 is a perspective view of a conventional light-emitting diode (LED) unit 2000 on which LED chips are mounted.

FIG. 12 is a top view illustrating a part of an LED chip 2001.

FIG. 13 is a cross-sectional view taken along a line A-A of FIG. 12.

Referring to FIG. 11, the LED unit 2000 includes primarily a plurality of LED chips 2001, a plurality of driver IC chips 2002, wires 2003 that connect between the LED chips 2001 and driver IC chips 2002, and a unit substrate 2005. Referring to FIG. 12, the LED chip 2001 includes light emitting elements 2101, electrodes 2102 for light-emitting elements 2101, and electrode pads 2103 for wiring. The electrode pads 2103 should have a sufficient area for reliable gold-wire bonding. Therefore, the pad size is selected to be about 100× 100 μm. The cost of a chip is determined by the number of chips produced from a sheet of semiconductor wafer. Thus, a small chip width is a key factor. There exists a need for a semiconductor device such as an LED chip and an IC chip where pads take up only a small area and wire bonding is not required.

One way of solving the aforementioned problems is that a semiconductor thin film is bonded onto an Si-substrate in which driver ICs are formed for controllably driving light-emitting elements and the semiconductor thin film is electrically connected to the driver ICs by means of metal wires. In this case, a critical point is the way in which the semiconductor thin film is bonded onto a substrate which is a different type from the semiconductor thin film.

For a type in which the light-emitting chips are bonded to an Si-substrate on which driver ICs are fabricated, a semiconductor thin film may be conveniently bonded to a metal layer formed on the Si-substrate. For a type where a semiconductor thin film is bonded to a substrate of a different type from the thin film semiconductor, a bonding method may be conveniently employed which utilizes Van der Waals forces that act between atoms or molecules of the semiconductor thin film and the substrate of the different type from the thin film semiconductor. However, for bonding based on the Van der Waals forces, surfaces of the semiconductor thin film and substrate are made hydrophilic and are then placed together so that the surfaces are bonded to each other due to hydrogen bonding. However, metal surfaces are often hydrophobic and therefore it has not been known what type of surface type is the most appropriate.

SUMMARY OF THE INVENTION

An object of the present invention is to provide a bonding that provides good, reliable bonding properties by using the Van der Waals forces between the semiconductor surface and metal surface.

A semiconductor composite apparatus includes a semiconductor thin film, a substrate, and a region. The substrate includes a metal surface to which the semiconductor thin film is bonded. The region contains an oxide of a metal that forms the metal surface. The region lies between the semiconductor thin film and the metal surface.

The metal surface is a surface of a metal layer provided on the substrate.

The metal surface contains an element selected from the group consisting of Pd, Ni, Ge, Pt, Ti, Cr, and Au.

The metal layer is either a surface of a Pd layer or a surface of an Ni layer. A semiconductor composite apparatus includes a substrate and a semiconductor thin film bonded to the substrate. A first metal layer is formed on a surface of the semiconductor thin film, the surface of the semiconductor thin film facing the substrate. A metal surface is formed on a surface of the substrate, surface of the substrate facing the semiconductor thin film. A region lying is formed between the first metal layer and the metal surface. The region contains an oxide of a metal element that forms the first metal layer and an oxide of a metal element that forms the metal surface.

The metal surface is either a Pd layer or an Ni layer. The metal surface contains an element selected from the group consisting of Pd, Ni, Ge, Pt, Ti, Cr, and Au.

The metal surface is either surface of a Pd layer or a surface of an Ni layer.

A semiconductor composite apparatus includes a semiconductor thin film separated from a first substrate and then bonded to a second substrate. The apparatus includes a first metal layer and a region. The first metal layer is formed on a surface of the semiconductor thin film, the first metal layer facing the second substrate. The region contains an oxide of a metal that forms the first metal layer, the region lying between the first metal layer and a surface of the second substrate.

The first metal layer contains an element selected from the group consisting of Pd, Ni, Ge, Pt, Ti, Cr, and Au.

The first metal layer is coated with either a Pd layer or an Ni layer.

The semiconductor thin film includes at least one of a light-emitting element, a light-receiving element, a transistor, a circuit element, and an integrated circuit.

The light-emitting element may be a light emitting diode.

The light-emitting diode may be a laser diode.

An LED head incorporates the aforementioned semiconductor composite apparatus.

An LED head incorporates the semiconductor composite apparatus. An optical device that adjusts light emitted from the semiconductor composite apparatus.

An image forming apparatus incorporates the LED head. A photoconductive body is illuminated by the LED head.

A method is used for manufacturing a semiconductor composite apparatus in which a semiconductor thin film is separated from a first substrate and is bonded to a second substrate including a metal layer formed thereon. The method includes the steps of:

bringing the semiconductor thin film into contact with the metal layer formed on the second substrate; and forming a region that contains an oxide of a metal element of the metal layer, the region lying between the semiconductor thin film and the metal layer.

A method is used for manufacturing a semiconductor composite apparatus in which a semiconductor thin film is separated from a first substrate and is bonded to a second substrate. The method includes the steps of:

forming a first metal layer on a surface of the semiconductor thin film, the surface facing the second substrate;

forming a second metal layer on the second substrate, the second metal layer facing the semiconductor thin film; and forming a region that contains an oxide of a metal element of the first metal layer and an oxide of a metal element of a second metal layer, the region lying between the first metal layer and the second metal layer.

A method is used for manufacturing a semiconductor composite apparatus in which a semiconductor thin film is separated from a first substrate and is bonded to a second substrate. The method includes the steps of:

forming a first metal layer on a surface of the semiconductor thin film, the surface facing the second substrate; and forming a region that contains an oxide of a metal element of the first metal layer, the region lying between the first metal layer and a surface of the second substrate.

A method is used for manufacturing a semiconductor composite apparatus. The method includes the steps of:

forming a metal layer on at least one of a semiconductor thin film and a substrate;

forming a metal oxide of an element of the metal layer; and forming a layer of water on the metal oxide and bringing the semiconductor thin film into intimate contact with the substrate with the layer of water lying between the semiconductor thin film and the substrate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIGS. 3A-3E illustrate the steps of forming a semiconductor thin film;

FIG. 4 is a model representation of the semiconductor thin film and the vicinity of a bonded interface between a metal layer and a metal oxide layer after the device in FIG. 3E is sintered;

DETAILED DESCRIPTION OF THE INVENTION

Figure 1:
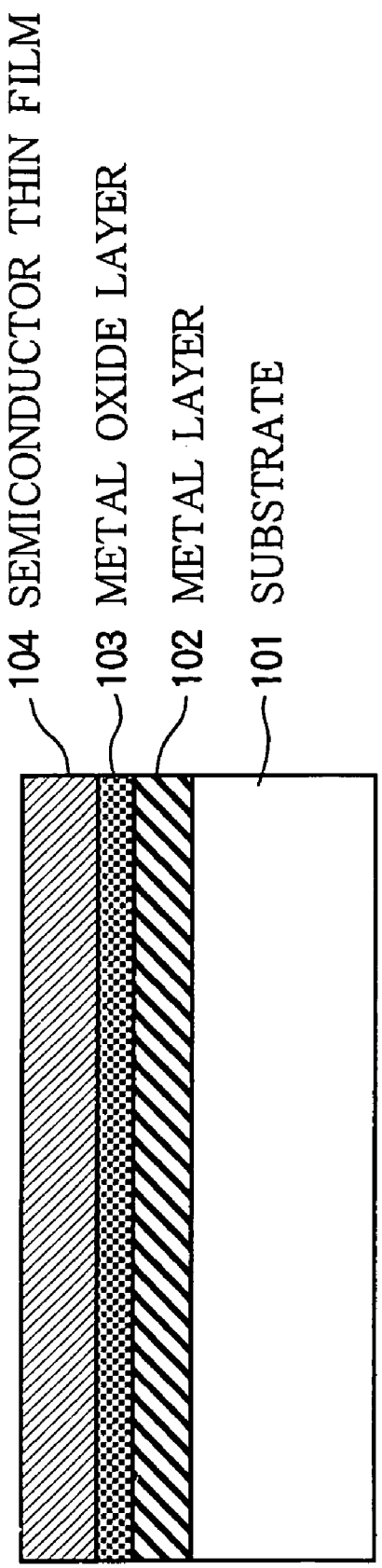
FIG. 1 is a model representation illustrating a first embodiment of the invention.

FIG. 1 is a model representation illustrating a first embodiment of the invention. Referring to FIG. 1, a substrate 101 is, for example, an Si substrate. A metal layer 102 is formed on the substrate 101. The metal layer 102 is of a single metal layer structure or a multi-metal layer structure. An oxide layer 103 includes an oxide layer that contains the element of the metal layer 102 and the element of a semiconductor thin film 104. The semiconductor thin film 104 is a thin layer of compound semiconductor that is formed of III-V groups of periodic table and is a single layer of semiconductor epitaxial layer or multi-layers of semiconductor epitaxial layer. The oxide layer 103 contains a metal oxide layer that contains the metal element of the metal layer 102, the metal oxide layer facing the metal layer 102. The oxide layer 103 contains an oxide layer that contains elements that form the semiconductor thin film 104, the oxide layer 103 facing the semiconductor thin film 104.

Figure 2:
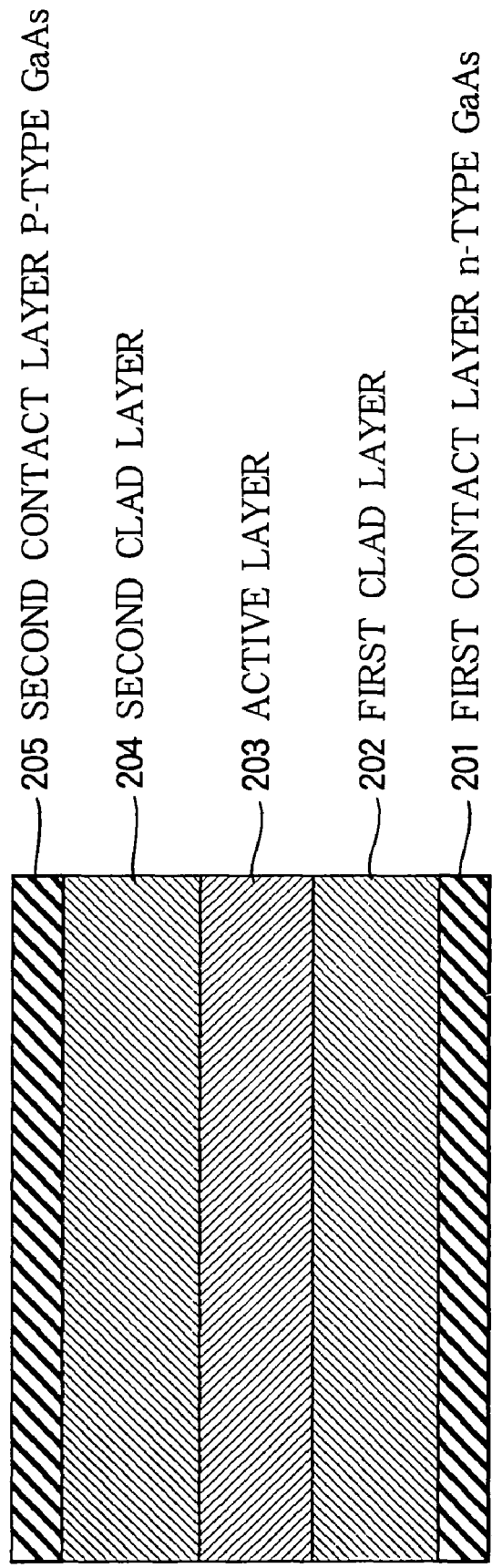
FIG. 2 illustrates an example of a semiconductor thin film detached from a second substrate.

FIG. 2 illustrates an example of another semiconductor thin film 104 transferred from another substrate. A first contact layer 201 is for example, an n-type layer of GaAs. A first clad layer 202 is, for example, an n-type layer of $Al_xGa_{1-x}As$. An active layer 203 is, for example, an n-type layer of $Al_yGA_{1-y}As$. A second clad layer 204 is, for example, a p-type layer of $Al_zGa_{1-z}As$. A second contact layer 205 is, for example, a p-type layer of GaAs. The variables x, y, and z are related such that $1 \geq x$ and $z > y \geq 0$.

Figure 3A:
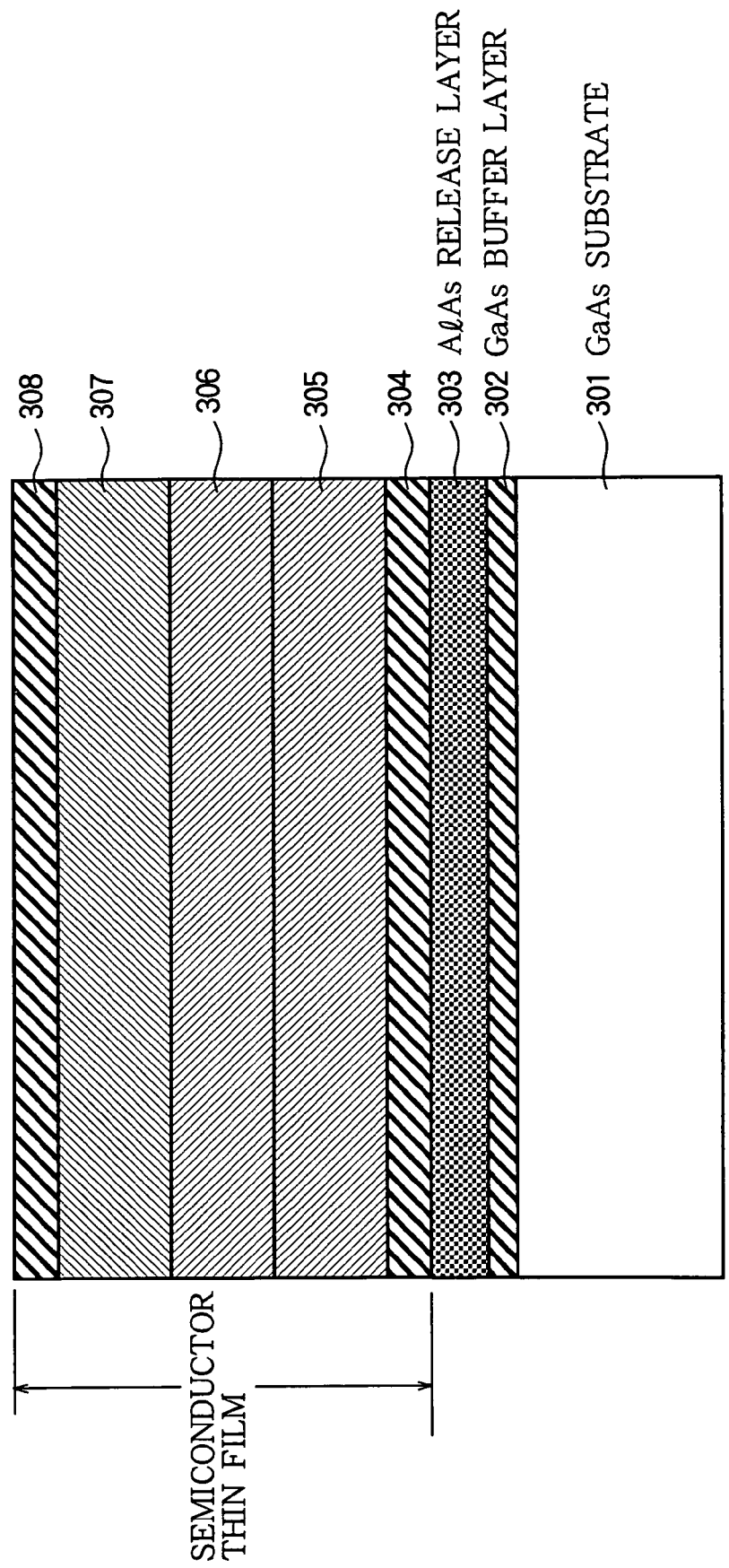

FIGS. 3A-3E illustrate the steps of forming still another semiconductor thin film that includes the layers 304 to 308. Referring to FIG. 3A, a substrate 301 is, for example, a GaAs substrate. A buffer layer 302 is, for example, a GaAs buffer layer. A release layer 303 is, for example, an AlAs layer. The release layer 303 can be etched selectively independently from the semiconductor thin film 104 while the semiconductor thin film 104 can be etched selectively independently from the release layer 303. The semiconductor thin film 104 includes at least one of a light-emitting element, a light-receiving element, a transistor, circuit element, and an integrated circuit.

Figure 3D:
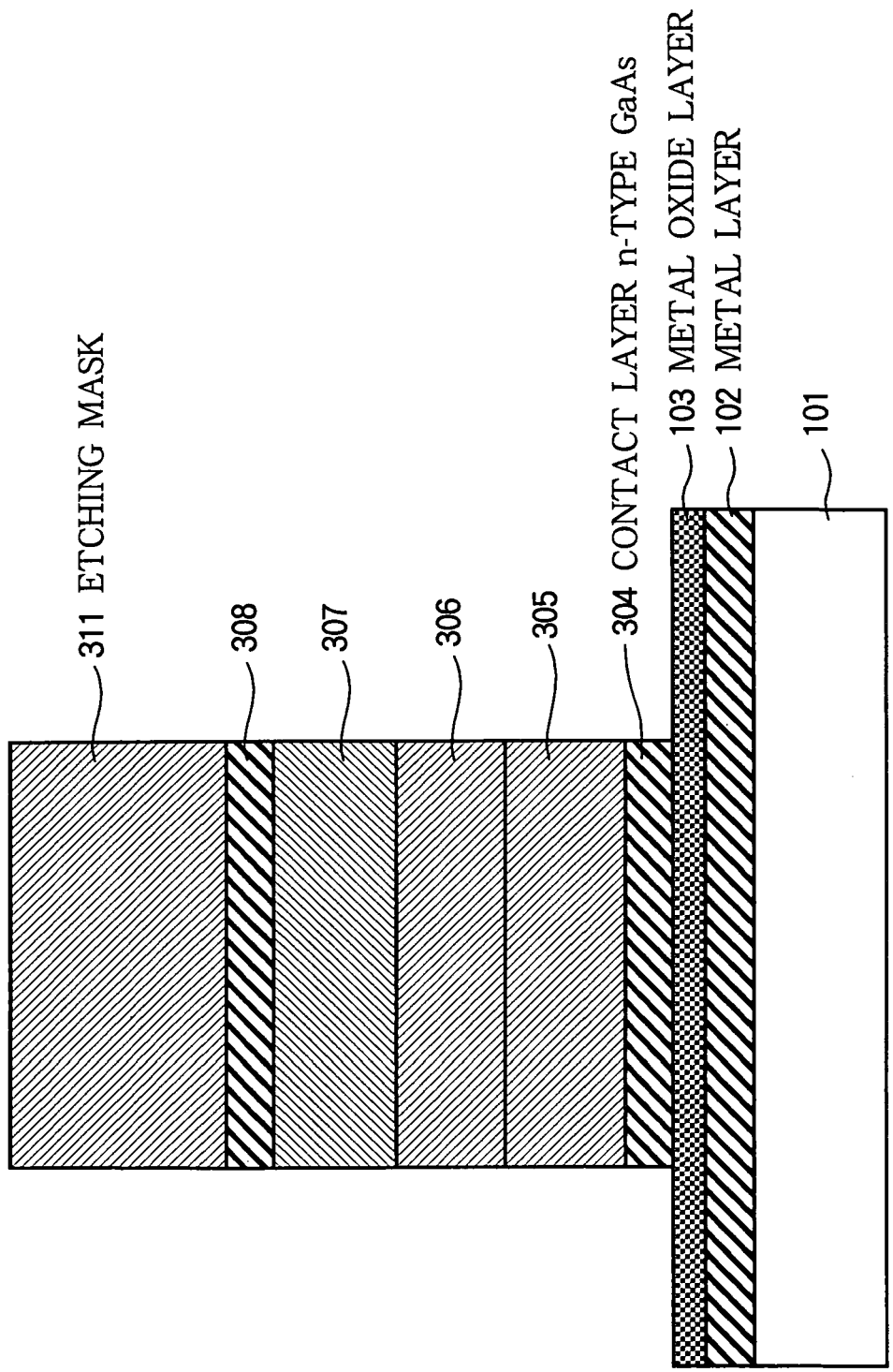

Referring to FIG. 3B, the etching mask 311 is formed on the semiconductor epitaxial substrate and a mesa-etch groove 312 is formed to divide the semiconductor thin film into a plurality of individual regions. The mesa-etch groove 312 has a depth such that at least the release layer 303 is exposed. Subsequently, the release layer 303 is etched to separate the individual regions (i.e., individual layers of semiconductor thin films 104) from the rest as shown in FIG. 3C. An etchant for this process may be, for example, 10%-hydrogen fluoride (HF). Alternatively, acids may be used that can etch a layer of semiconductor thin film and the release layer independently. After etching, an individual region is bonded to another substrate, e.g., an Si-substrate on which the metal layer 102 and the metal oxide layer 103 are formed (FIG. 3D).

The metal layer 102 may be a single layer of Pd, a single layer of Ni, or a metal layer such as a single layer, a multilayer, or an alloy layer that contains at least one of Au, Ge, Pt, Ti, and Cr. The metal layer 102 may also be an Au-containing metal layer coated with a Pd layer or an Au-containing metal layer coated with an Ni layer. Au is highly resistant to oxidation. Thus, if the metal layer 102 is made of Au, a very thin oxide film (e.g., 3 to 5 nm thick), a very thin Au film (e.g., 3 to 5 nm thick) that has attracted oxygen, or a composite layer of these films is formed. The surface of the metal layer 102 is exposed to oxygen plasma to form a very thin metal oxide layer on the surface of the metal layer. When the surface of a metal layer is covered with a metal, the surface is hydrophobic, i.e., the surface repels water. However, because a thin oxide layer is formed on the outermost surface of the metal, the surface is hydrophilic. This allows preparing of the semiconductor thin film that can be intimately attached to the bonding region. It is considered that oxygen atoms are highly hydrophilic and therefore oxygen atoms on the surface of the metal oxide attract water molecules. In addition to the aforementioned metals, aluminum may be used to form the metal layer. However, the surface of aluminum is difficult to be flat, and therefore conditions for making films may be preferably altered so that the resultant aluminum surface can be flat or the metal layer 102 is subjected to a surface-flattening treatment after the film is formed.

The metal oxide layer 103 may have any thickness. For example, in order to provide good electrical contact between the semiconductor thin film and the metal layer, the thickness is preferably in the range of 1 to 10 nm. Following are the reasons. For establishing a good electrical contact between the back side of the semiconductor thin film and the metal layer, sintering is performed after bonding the semiconductor thin film so that the atoms in the vicinity of the interface between the semiconductor thin film and the metal layer are interdiffused and/or intermixed, and alloyed. Sintering is performed at a temperature in the range of 100 to 400° C. for a time length in the range of 0.5 to 5 hours. If the oxide layer 103 is thick, atoms of the semiconductor thin film and the metal layer will not pass through the oxide layer. In other words, the semiconductor thin film and the metal layer will not react with each other, failing to form a low resistance contact.

Subsequently, the semiconductor thin film is brought into an intimate contact with the metal layer/metal-oxide layer by means of moisture for Van der Waals Bonding (VDWB). Then, the etching mask 311 on the semiconductor thin film is removed (FIG. 3E).

FIG. 4 is a model representation of the semiconductor thin film illustrating the vicinity of the bonded interface between the metal layer and metal oxide layer after the device in FIG. 3E is further sintered at a temperature of 200° C. for 1 hour. Sintering is performed at a temperature lower than the melting point of the metal oxide layer 103. For example, the sintering for Au is performed at a temperature lower than 1064° C. In other words, the sintering is performed for a time length and at a temperature such that oxide molecules or oxygen atoms in chemical combination with the metal can diffuse into the metal. Referring to FIG. 4, a surface oxide portion of a metal layer 102 diffuses into the metal oxide layer 103 formed between the contact layer 304 of the semiconductor thin film and the metal layer 102, and into an oxide layer on the surface oxide portion of the contact layer 304, thereby forming a metal/semiconductor reaction region 410. This not only provides reliable bonding between the semiconductor thin film and the metal layer but also establishes good electrical contact of a low resistance between the semiconductor thin film and the metal layer.

Figure 5:
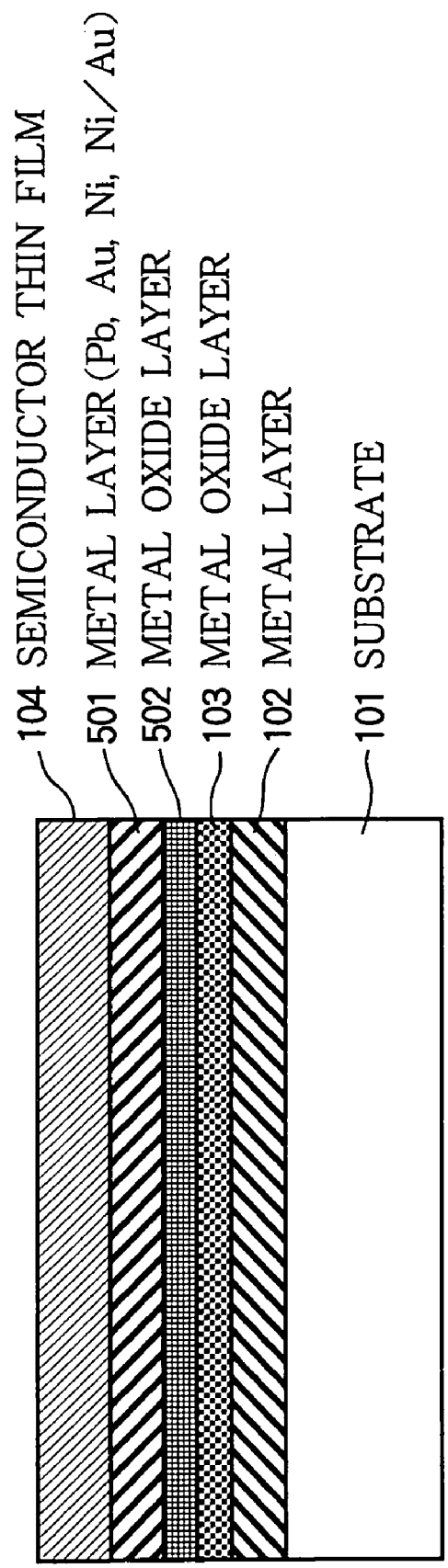
FIG. 5 illustrates a second embodiment.

According to the first embodiment, when a semiconductor thin film is to be bonded on a substrate of different material with a metal layer positioned between the semiconductor thin film and the substrate, an oxide layer is formed on the surface of the metal layer. This allows using of moisture between the semiconductor thin film and the metal layer for improving intimate contact of the semiconductor thin film with the metal layer. This offers excellent bonding strength. The provision of a metal oxide layer is effective in easing the reaction between the metal and the contact layer (i.e., bonding layer) of the semiconductor thin film so that voids produced during the reaction can be minimized for reliable bonding interface. The first embodiment has been described with respect to an Si substrate as a semiconductor substrate. The semiconductor substrate may also be a semiconductor substrate such as a GaAs substrate, an insulating substrate such as a ceramic substrate and a glass substrate, or an electrically conductive substrate made of metals such as copper, stainless steel, or aluminum. When a metal substrate is to be employed, this can eliminate the need for forming a metal layer on the metal substrate and oxidizing the metal layer. That is, a roughness on the order of nano meters can be formed on the surface of the substrate and the rough surface can then be oxidized Second Embodiment FIG. 5 illustrates a second embodiment. A substrate 101 is, for example, an Si substrate. A metal layer 102 is formed on the Si substrate 101. Then, an oxide layer 103 of the metal layer 102 is formed on the metal layer 102. A metal layer 501 is formed under a contact layer of a semiconductor thin film 104. A metal oxide layer 502 is formed under the metal layer 501. The second embodiment differs from the first embodiment in that a metal layer/metal-oxide layer is formed on the semiconductor thin film 104 side as well.

The metal layer 501 may be a metal layer that contains Pd, Au, Ge, Ni, Pt, or Ti, an Ni layer, or a metal layer that contains Au and is covered with a Pd layer or a Ni layer. Just as in the first embodiment, the metal oxide layer 502 may be formed, for example, by means of oxygen plasma. The thickness of the metal oxide layer 502 is preferably in the range of 1 to 10 nm if electrical contact is to be formed in the vicinity of the bonded interface between the semiconductor thin film and the metal layer.

Figure 6:
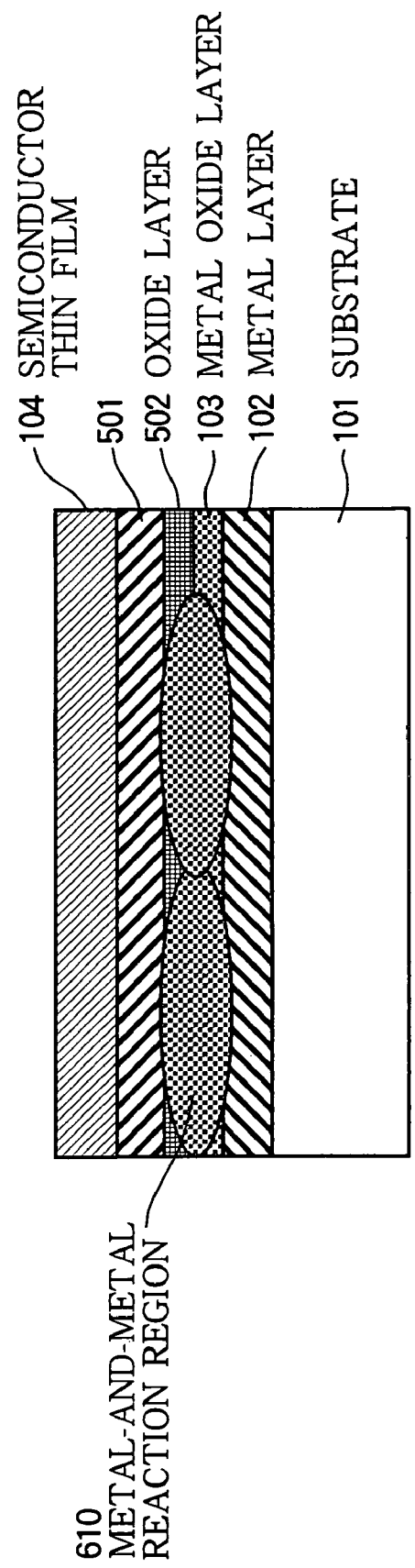
FIG. 6 illustrates a reaction in the vicinity of the bonded interface after sintering the structure in FIG. 5.

FIG. 6 illustrates the reaction that takes place in the vicinity of the bonded interface after sintering the structure in FIG. 5 at a temperature of 200° C. for 1 hour. Referring to FIG. 6, a metal diffuses into a metal oxide layer 103 and a metal oxide layer 502 to form a metal-and-metal reaction region 610, i.e., a metal-and-metal oxide layer.

According to the second embodiment, in addition to the structure according to the first embodiment, a metal/metal-oxide layer is formed on the semiconductor thin film side as well. This offers a highly intimate junction interface so that a further lower contact resistance can be implemented between the semiconductor thin film and the metal layer. Because both substrate and the semiconductor thin film supply metal materials, the metal can diffuse into the metal oxide layer sufficiently, thereby resulting in a highly strong bonding without voids.

Third Embodiment

Figure 7:
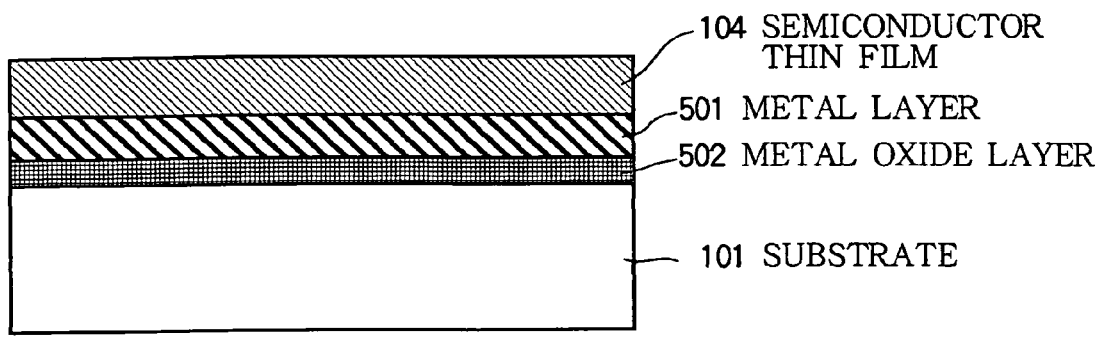
FIG. 7 illustrates a third embodiment.
Figure 8:
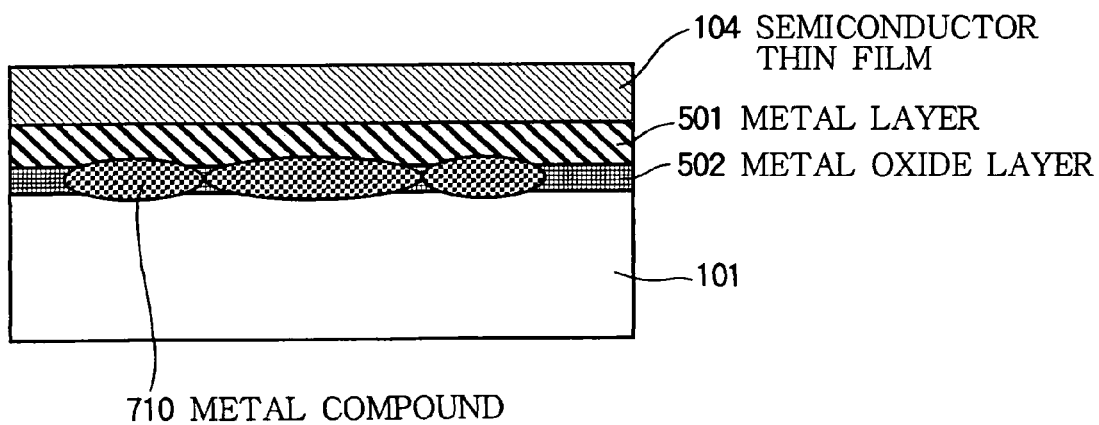
FIG. 8 is a model representation of the vicinity of a bonded interface after sintering the structure in FIG. 7.

FIG. 7 illustrates a third embodiment. The third embodiment differs from the first embodiment in that a metal layer 501 and a metal oxide layer 502 are formed on a semiconductor thin film 104 side. A substrate 101 in FIG. 7 is an Si substrate. FIG. 8 is a model representation illustrating the vicinity of the bonded interface after sintering the structure in FIG. 7 at a temperature of 500° C. for 10 minutes. It is to be noted that a metal layer 501 has diffused into an oxide layer 502 to form a metal compound 710 between the Si substrate 101 and the metal layer 501.

According to the third embodiment, the metal layer 501 and the metal oxide layer 502 are formed on the semiconductor thin film 104 side. This structure allows the device to be sintered at a higher temperature, resulting in a lower contact resistance between the semiconductor thin film 104 and the metal layer 501 as well as forming a silicide between the metal layer 501 and the Si substrate 101 for good bonding effect.

Figure 9:
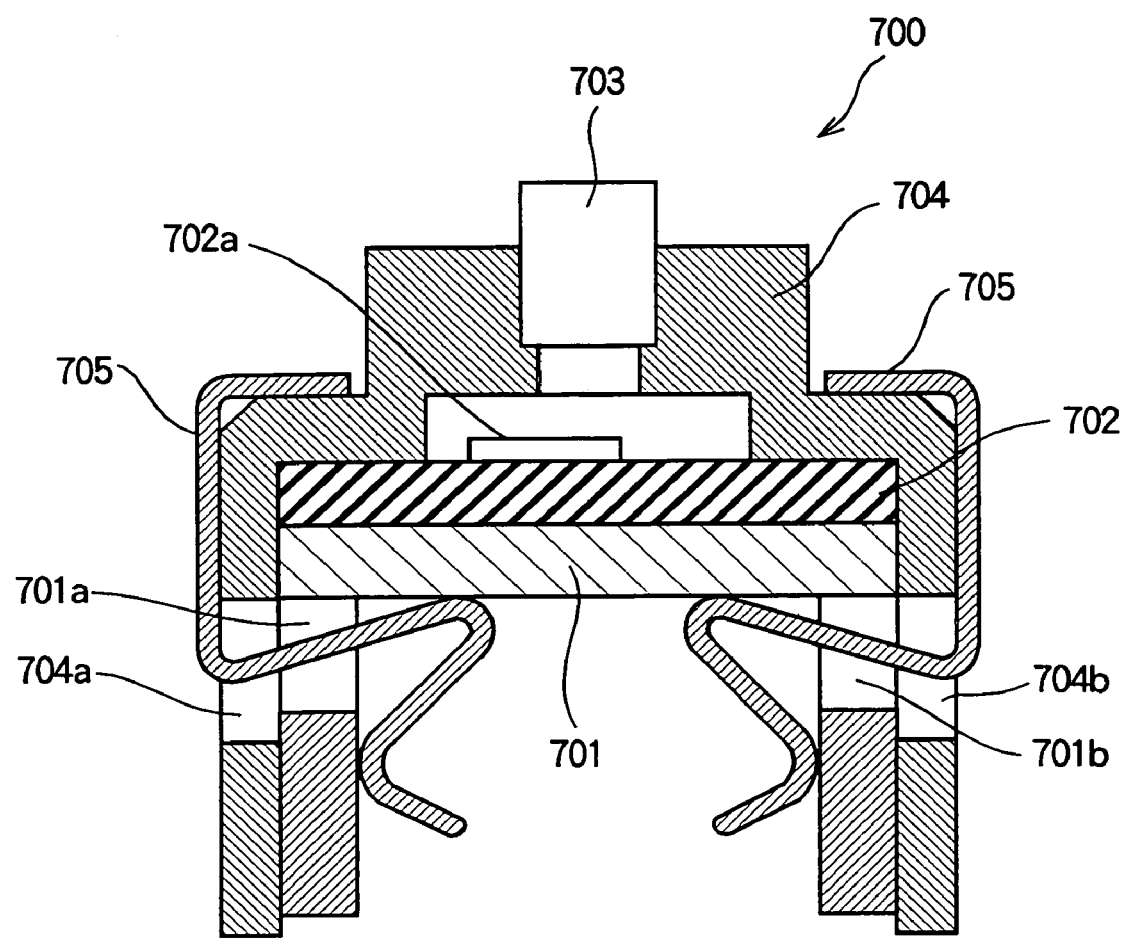
FIG. 9 is a side cross-sectional view of an LED head on which a semiconductor device according to the present invention is mounted.

FIG. 9 is a side cross-sectional view of an LED head on which a semiconductor device according to the present invention is mounted. Referring to FIG. 9, an LED head 700 includes a base member 701 and an LED unit 702 that is fixedly mounted on the base member 701. The LED unit 702 employs any one of various LED/driver composite chips according to the first to third embodiments. A light-emitting section 702a is formed on the previously mentioned semiconductor epitaxial layer, and includes a number of light-emitting elements aligned in line. A rod lens array 703 extends over the light-emitting section 702a and focuses the light emitted from the light-emitting section 702a on a surface of an appropriate external member. The rod lens array 703 includes a plurality of rod-like optical lenses aligned along the line of light-emitting elements. A lens holder 104 holds the rod lens array 103 in position.

The lens holder 704 is formed to enclose the base member 701 and LED unit 702. Clampers 705 extend through openings 701a, 701b, 704a, and 704b, and hold the base member 701, LED unit 702, and lens holder 704 firmly in a stacked relation.

The light emitted from the light-emitting section 702a passes the rod lens array 703 and illuminates the surface of the appropriate external member. The LED head 700 is used as a photolithography machine in electrophotographic image forming apparatuses and electrophotographic copying machines.

The aforementioned LED head 700 uses one of the LED/driver IC composite chips described in the previous embodiments and therefore provides a compact, high-quality, and cost-saving LED head.

Figure 10:
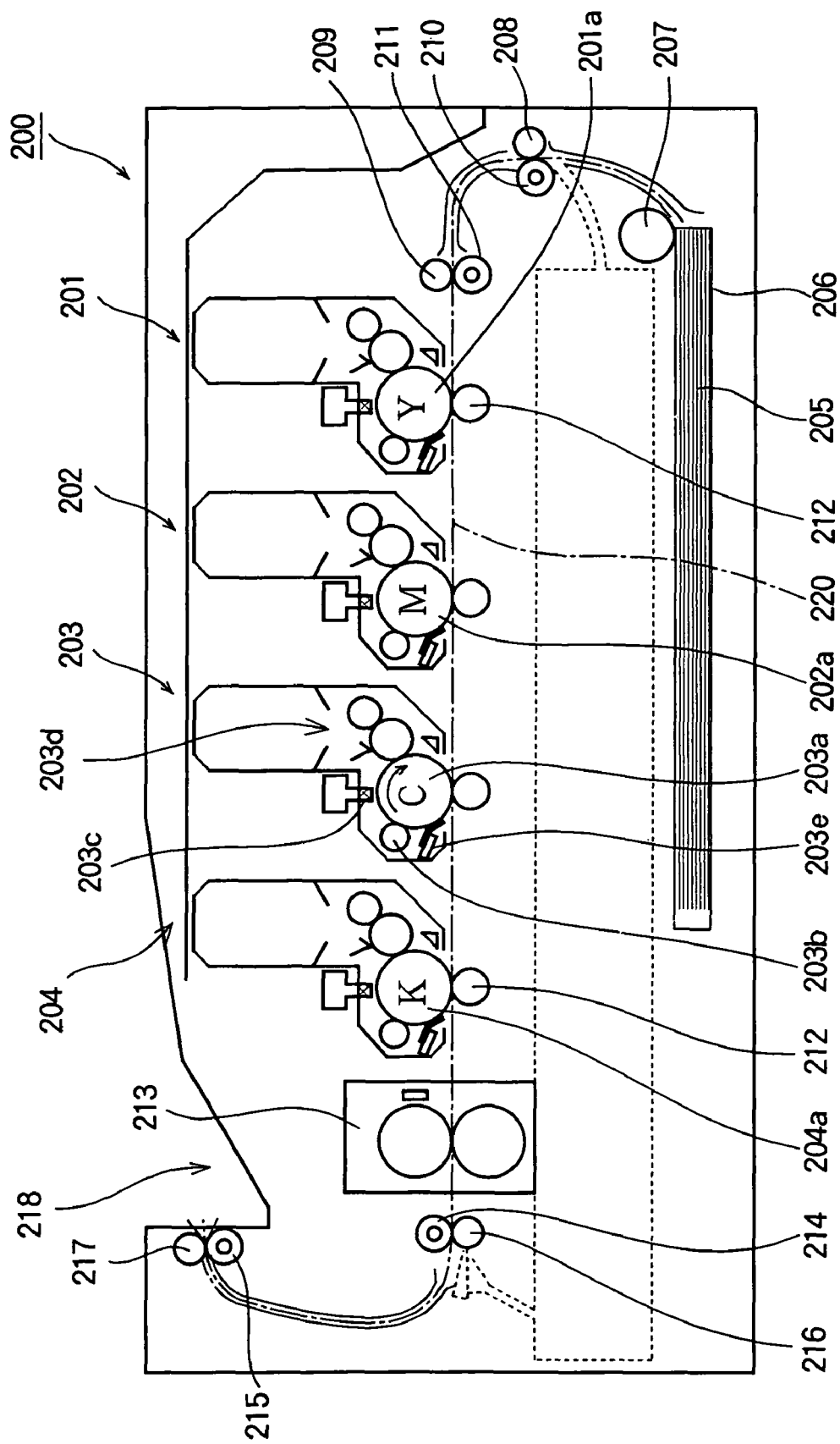
FIG. 10 illustrates an image forming apparatus incorporating an LED head that employs a semiconductor composite device according to the present invention.
Figure 11:
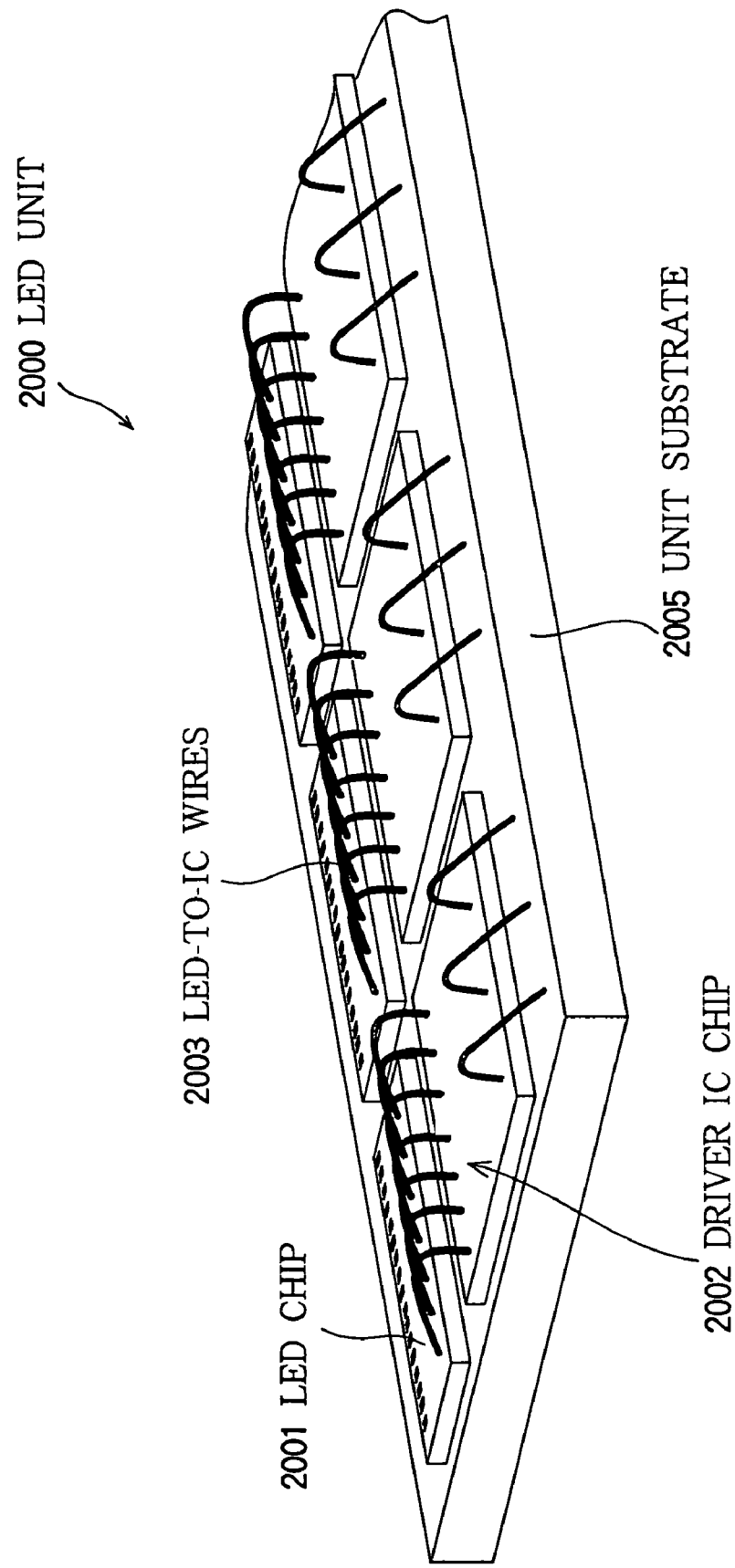
FIG. 11 is a perspective view of a conventional light-emitting diode (LED) unit on which LED chips are mounted.
Figure 12:
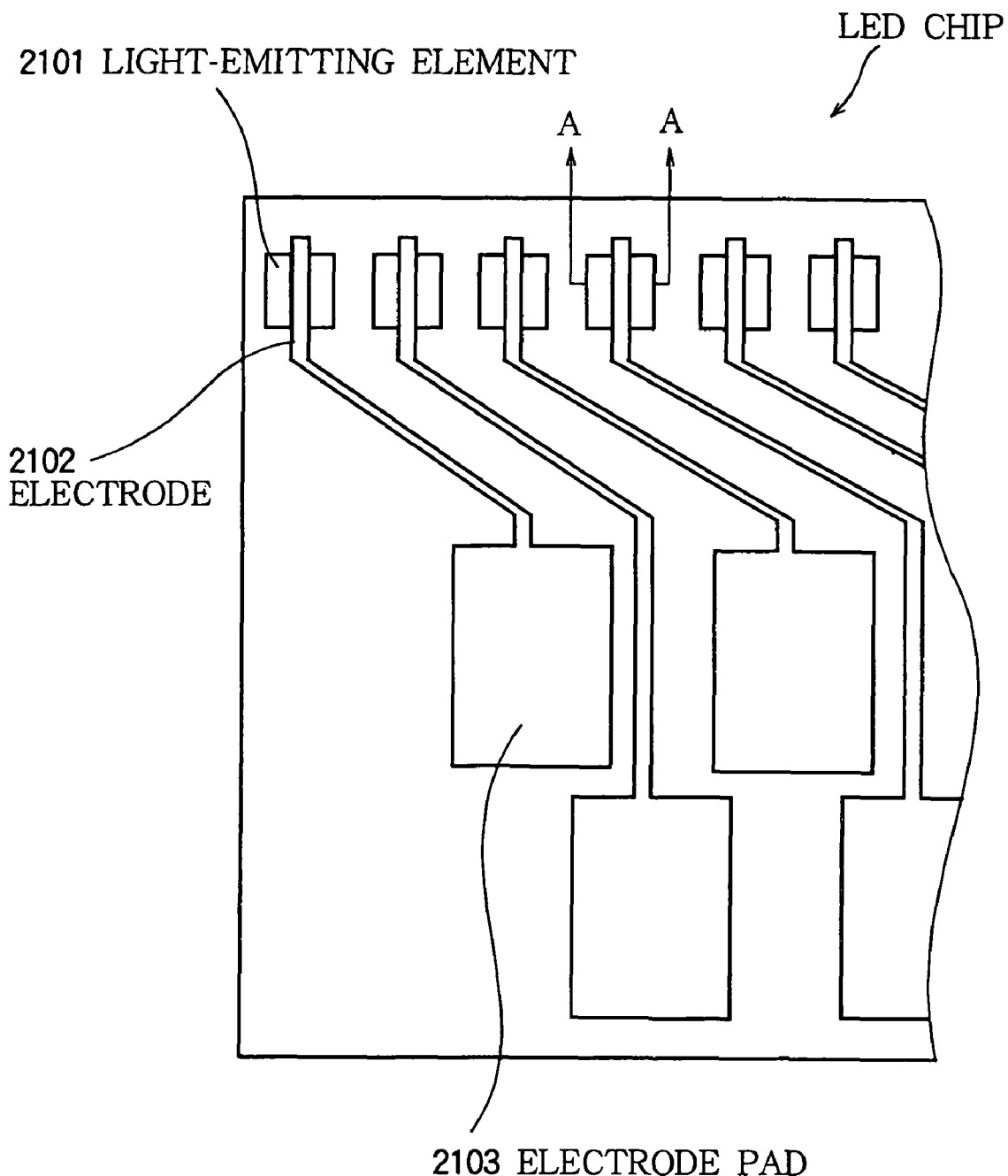
FIG. 12 is a top view illustrating a part of an LED chip of FIG. 11.
Figure 13:
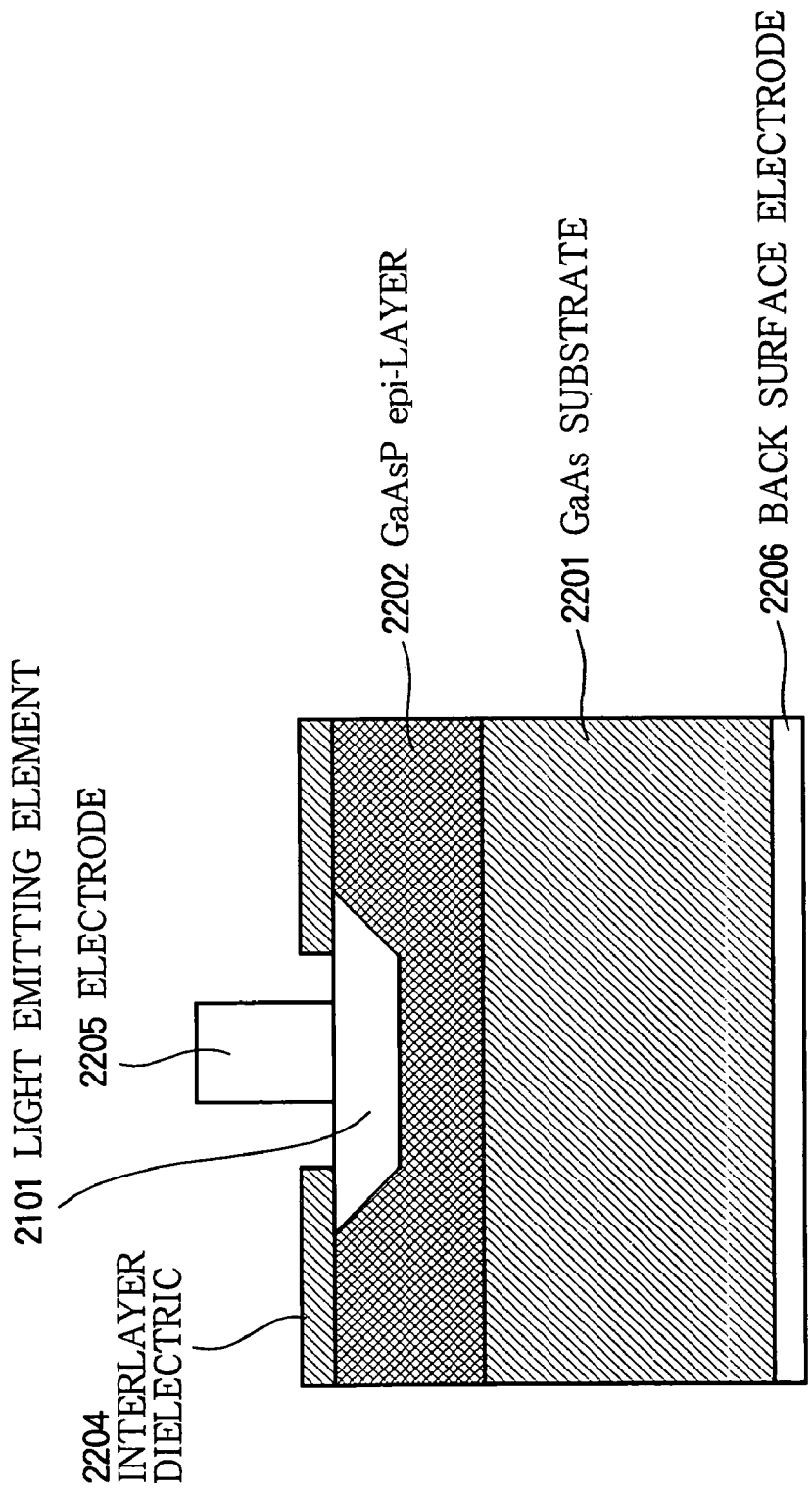
FIG. 13 is a cross-sectional view taken along a line A-A of FIG. 12.

FIG. 10 illustrates an image forming apparatus 200 incorporating an LED head that employs a semiconductor composite device according to the present invention. Referring to FIG. 10, the image forming apparatus 200 includes process units 201-204 that form yellow, magenta, cyan, and black images. The process units 201-204 are aligned in this order from an upstream side of a transport path for a recording medium to a downstream side. Each of the process units 201-204 may be substantially identical; for simplicity only the operation of the process unit 203 will be described, it being understood that the other process units may work in a similar fashion.

The process unit 203 includes a photoconductive drum 203a that rotates in a direction shown by arrow C. A charging unit 203b, exposing unit 203c, developing unit 203d, and cleaning unit 203e are disposed to surround the photoconductive drum 203a, being aligned from an upstream side to a downstream side with respect to a direction of rotation of the photoconductive drum 203a. The charging unit 203b charges the surface of the photoconductive drum 203a. The exposing unit 203c illuminates the charged surface of the photoconductive drum 203a to form an electrostatic latent image. The developing unit 203d supplies toner to the electrostatic latent image to develop the electrostatic latent image into a toner image. The cleaning unit 203e removes the toner remaining on the photoconductive drum 203a after transferring the toner image onto a recording medium 205. Drums or rollers used in these units are driven in rotation by a drive source, not shown, via a gear train.

A paper cassette 206 is provided at a lower portion of the image forming apparatus 200, and holds a stack of the recording medium 205 such as paper therein. A hopping roller 207 is disposed over the paper cassette 206 and feeds the recording medium 205 on a page-by-page basis to the transport path. There are provided pinch rollers 208 and 209, a transporting roller 210, and a registry roller 211 in the transport path downstream of the hopping roller 207. The pinch rollers 208 and 209 and the transporting roller 210 hold the recording medium 205 in a sandwiched relation and transport the recording medium 205. The registry roller 211 minimizes skew between the recording medium 205 and the transport path and then transports the recording medium 205 to the process unit 201. The hopping roller 207, transporting roller 210, and registry roller 211 are driven in rotation by a drive source, not shown, via, for example, a gear train.

Transfer rollers 212 are formed of a semi conductive rubber and are provided to oppose the photoconductive drums of the process units 201-204. The transfer roller 212 receives a high voltage for transferring a toner image from the surface of the photoconductive drum 203a to the recording medium 205.

A fixing unit 213 includes a heat roller and a back-up roller so that the toner image on the recording medium 205 is fused into a permanent image under heat and pressure. Discharging rollers 214 and 215 cooperate with the pinch rollers 216 and 217 to hold the recording medium 205 in a sandwiched relation and transport the recording medium 205 to a stacker. The fixing units 213 and discharging roller 214 are driven in rotation by a drive source, not shown, via, for example, a gear train. The exposing unit 203c takes the form of the aforementioned LED head.

The operation of the aforementioned image forming apparatus 200 will be described. The hopping roller 207 feeds the recording medium 205 on a page-by-page basis. Then, the recording medium 205 is held between the transporting roller 210, registry roller 211 and pinch rollers 208 and 209 in a sandwiched relation, and is transported to the process unit 201. The recording medium 205 is pulled in between the photoconductive drum 201a and the transfer roller 212 so that the toner image is transferred onto the recording medium 205 as the recording medium 205 is advanced between the photoconductive drum 201a and the transfer roller 212.

The recording medium 205 passes through the process units 201-204. The exposing units 201c-204c form electrostatic latent images of corresponding colors and the developing units 201d-204d develop the corresponding electrostatic latent images to form toner images of the corresponding colors. As the recording medium 205 passes through the process units 201d-204d, the toner images of corresponding colors are transferred onto the recording medium in registration. The recording medium 205 then enters the fixing unit where the toner images are fixed into a full color permanent image. Then, the recording medium 205 is held between the discharging rollers 214 and 215 and the pinch rollers 216 and 217 in a sandwiched relation so that the recording medium 205 is discharged to the stacker 218.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A method for manufacturing a semiconductor composite apparatus in which a semiconductor thin film having a surface is bonded onto a metal layer formed on a substrate formed separately from the semiconductor thin film, the method comprising the steps of:
   forming a metal oxide surface on the metal layer;
   bringing the surface of the semiconductor thin film into intimate contact with the metal oxide surface; and
   sintering the substrate and the semiconductor thin film in intimate contact with the substrate.

2. A method for manufacturing a semiconductor composite apparatus in which a semiconductor thin film is bonded onto a substrate formed separately from the semiconductor thin film, the semiconductor thin film having a surface on which a first metal layer is formed and the substrate having a surface on which a second metal layer is formed, the method comprising the steps of:
   forming a metal oxide surface on at least one of the first metal layer and the second metal layer;
   bringing the semiconductor thin film into intimate contact with the substrate such that the first metal layer is in intimate contact with the second metal layer with the metal oxide surface lying between the first metal layer and the second metal layer; and
   sintering the substrate and the semiconductor thin film in intimate contact with the substrate.

3. A method for manufacturing a semiconductor composite apparatus in which a semiconductor thin film is bonded onto a substrate formed separately from the semiconductor thin film, the semiconductor thin film' having a surface on which a metal layer is formed and the substrate having a surface onto which the semiconductor thin film is bonded, the method comprising the steps of:
   forming a metal oxide surface on the metal layer;
   bringing the semiconductor thin film into intimate contact with the substrate such that the metal oxide surface is in intimate contact with the surface of the substrate with the metal oxide surface lying between the metal layer and the substrate; and
   sintering the substrate and the semiconductor thin film in intimate contact with the substrate.

4. A method for manufacturing a semiconductor composite apparatus in which a semiconductor thin film is bonded onto a substrate formed separately from the semiconductor thin film, the semiconductor thin film having a first surface and the substrate having a second surface onto which the semiconductor thin film is bonded, the method comprising the steps of:
   forming a metal layer on one of the first surface and the second surface;
   forming a metal oxide surface on the metal layer;
   bringing the semiconductor thin film into intimate contact with the substrate such that the first surface is in intimate contact with the second surface with a layer of water and the metal oxide surface lying between the semiconductor thin film and the substrate; and
   sintering the substrate and the semiconductor thin film in intimate contact with the substrate.

5. A method for manufacturing a semiconductor composite apparatus in which a semiconductor thin film is bonded onto a substrate formed separately from the semiconductor thin film, the semiconductor thin film having a first surface and the substrate having a second surface onto which the semiconductor thin film is bonded, the method comprising the steps of:
   forming a first metal layer on the first surface and the second metal layer on the second surface;
   forming a metal oxide surface on at least one of the first metal layer and the second metal layer; and
   bringing the semiconductor thin film into intimate contact with the substrate such that the first metal layer in intimate contact with the second metal layer with a layer of water and the metal oxide surface lying between the first metal layer and the second metal layer; and
   sintering the substrate and the semiconductor thin film in intimate contact with the substrate.

* * * * *